(12) United States Patent
Arai et al.

(10) Patent No.: US 8,969,220 B2
(45) Date of Patent: Mar. 3, 2015

(54) METHODS AND SYSTEMS FOR LASER PROCESSING OF COATED SUBSTRATES

(71) Applicant: IMRA America, Inc., Ann Arbor, MI (US)

(72) Inventors: Alan Y. Arai, Fremont, CA (US); Gyu Cheon Cho, Ann Arbor, MI (US); Jingzhou Xu, Ann Arbor, MI (US)

(73) Assignee: IMRA America, Inc., Ann Arbor, MI (US)

( * ) Notice: Subject to any disclaimer, the term of this patent is extended or adjusted under 35 U.S.C. 154(b) by 0 days.

(21) Appl. No.: 13/714,896

(22) Filed: Dec. 14, 2012

(65) Prior Publication Data

US 2013/0183837 A1   Jul. 18, 2013

Related U.S. Application Data

(60) Provisional application No. 61/586,332, filed on Jan. 13, 2012.

(51) Int. Cl.
*H01L 21/268* (2006.01)
*B23K 26/00* (2014.01)
*H01L 21/78* (2006.01)
*H01L 33/00* (2010.01)

(52) U.S. Cl.
CPC ........ *H01L 21/2686* (2013.01); *B23K 26/0048* (2013.01); *B23K 26/0057* (2013.01); *H01L 21/78* (2013.01); *H01L 33/0095* (2013.01); *Y10S 438/94* (2013.01)
USPC ............ 438/795; 257/E21.028; 257/E21.347; 257/E21.596; 257/E21.599; 438/458; 438/463; 438/940

(58) Field of Classification Search
USPC .................. 257/E21.028, E21.347, E21.596, 257/E21.599; 438/458, 463, 795, 940
See application file for complete search history.

(56) References Cited

U.S. PATENT DOCUMENTS

| 7,486,705 | B2 | 2/2009 | Shah |
| 8,158,493 | B2 | 4/2012 | Shah |
| 2002/0023903 | A1 | 2/2002 | Ann Ngoi et al. |

(Continued)

FOREIGN PATENT DOCUMENTS

| EP | 2340911 A1 | 7/2011 |
| WO | WO2010139841 A1 | 12/2010 |
| WO | WO2011071886 A1 | 6/2011 |

OTHER PUBLICATIONS

International Search Report and Written Opinion from International Patent Application No. PCT/US12/69825, mailed Feb. 26, 2013, in 12 pages.

(Continued)

*Primary Examiner* — Asok K Sarkar
(74) *Attorney, Agent, or Firm* — Knobbe, Martens, Olson & Bear, LLP

(57) ABSTRACT

Examples of methods and systems for laser processing of materials are disclosed. Methods and systems for singulation of a wafer comprising a coated substrate can utilize a laser outputting light that has a wavelength that is transparent to the wafer substrate but which may not be transparent to the coating layer(s). Using techniques for managing fluence and focal condition of the laser beam, the coating layer(s) and the substrate material can be processed through ablation and internal modification, respectively. The internal modification can result in die separation.

17 Claims, 6 Drawing Sheets

(56) References Cited

U.S. PATENT DOCUMENTS

| | | |
|---|---|---|
| 2006/0207976 A1 | 9/2006 | Bovatsek |
| 2006/0261050 A1 | 11/2006 | Krishnan et al. |
| 2006/0285561 A1 | 12/2006 | Shah |
| 2007/0228616 A1 | 10/2007 | Bang |
| 2007/0298529 A1 | 12/2007 | Maeda |
| 2008/0050888 A1* | 2/2008 | Garner et al. ............ 438/463 |
| 2009/0212030 A1 | 8/2009 | Clifford, Jr. |
| 2010/0025387 A1 | 2/2010 | Arai |
| 2010/0301027 A1 | 12/2010 | Sercel |
| 2011/0031508 A1 | 2/2011 | Hamaguchi |
| 2011/0049765 A1* | 3/2011 | Li et al. ............ 264/400 |
| 2011/0100966 A1 | 5/2011 | Nagatomo |
| 2011/0132885 A1 | 6/2011 | Sercel |
| 2011/0155706 A1 | 6/2011 | Nagatomo |
| 2011/0240617 A1 | 10/2011 | Xu |

OTHER PUBLICATIONS

Jae-Hoon Lee et al., "Enhanced Extraction Efficiency of InGaN-Based Light-Emitting Diodes Using 100-kHz Femtosecond-Laser-Scribing Technology", IEEE Electron Device Letters, vol. 31, No. 3, Mar. 2010, pp. 213-215.

Jae-Hoon Lee et al., "Stress Reduction and Enhanced Extraction Efficiency of GaN-Based LED Grown on Cone-Shape-Patterned Sapphire", IEEE Photonics Tech. Ltrs., vol. 20, No. 18, Sep. 15, 2008, pp. 1563-1565.

Yufeng Li et al., "Defect-Reduced green GaInN/GaN light-emitting diode on nanopatterned sapphire," Appl. Phys. Lett., vol. 98, Apr. 11, 2011, pp. 151102-1 to 151102-3.

International Preliminary Report on Patentability from International Patent Application No. PCT/US12/69825, issued Jul. 15, 2014, in 6 pages.

* cited by examiner

METHODS AND SYSTEMS FOR LASER PROCESSING OF COATED SUBSTRATES

CROSS-REFERENCE TO RELATED APPLICATIONS

This application claims the benefit of priority under 35 U.S.C. §119(e) to U.S. Provisional Patent Application No. 61/586,332, filed Jan. 13, 2012, entitled "METHODS AND SYSTEMS FOR LASER PROCESSING OF COATED SUBSTRATES," which is hereby incorporated by reference herein in its entirety.

FIELD

This disclosure generally relates to processing materials using pulsed lasers. Various implementations can be used for cutting, scribing, dicing, singulating, or otherwise processing materials such as semiconductor wafers, multilayer materials, composite materials, and so forth.

BACKGROUND

Conventional methods for semiconductor wafer singulation use diamond saw cutting or other mechanical dicing apparatus. In recent years there has been a trend to reduce semiconductor wafer thickness, which can lead to reduced package size and the ability to stack silicon wafers to achieve higher integrated circuit density and integration. The reduced thickness of wafers has led to challenges for wafer singulation that uses saw cutting or mechanical dicing, for example, chipping along die edges.

SUMMARY

In one aspect, the present disclosure provides a method for using a processing laser in singulation of light emitting diode (LED) or other semiconductor devices having a coating on a substrate.

Embodiments of the present disclosure provide methods for laser internal processing for die singulation when a coating layer is present on the substrate.

In at least one embodiment, a first laser beam ablates the coating layer. A clean ablation trench allows the laser beam to be focused inside the substrate. A second laser beam, passing through the ablation trench, modifies an internal portion of the substrate. The internal modification facilitates subsequent die separation.

In another aspect of the present disclosure, focal condition and/or energy of a laser beam are managed so that both ablation of coating layer(s) and modification of an internal portion of the substrate occurs during a single processing pass in which the substrate and laser pulses are moved relative to one another. Thus, the coating and substrate processing can be carried out in parallel, and essentially simultaneously when compared to a multiple pass process. In some implementations the dies can be separated with a one step processing pass.

In another aspect, a system for processing a workpiece is provided. The workpiece comprises a substrate and a layer formed on the substrate, and the layer has an ablation threshold that is less than an ablation threshold of the substrate. The system comprises a laser source configured to provide laser pulses having a pulse energy and a wavelength, where the substrate is substantially transparent to the laser pulses at the wavelength. The system also comprises a beam delivery system configured to deliver the laser pulses to the workpiece, focusing optics, and a controller. The controller is configured to adjust fluence of the laser pulses and to adjust the focusing optics to provide desired focal conditions of the laser pulses at the layer and at a focal spot inside the substrate such that: (1) intensity of the laser pulses in or near the layer is at or above the ablation threshold of the layer and below the ablation threshold of the substrate, and (2) intensity of the laser pulses near a focal spot in the substrate is at or above the ablation threshold of the substrate.

In another aspect, a method for processing a workpiece is provided. The workpiece comprises a substrate and a layer formed on the substrate, with the layer having an ablation threshold that is less than an ablation threshold of the substrate. The method comprises providing laser pulses having a pulse energy and a wavelength, where the substrate is substantially transparent to the laser pulses at the wavelength. The method also comprises delivering the laser pulses to the workpiece, and adjusting fluence and focal conditions of the laser pulses such that: (1) intensity of the laser pulses in or near the layer is at or above the ablation threshold of the layer and below the ablation threshold of the substrate, and (2) intensity of the laser pulses near a focal spot in the substrate is at or above the ablation threshold of the substrate.

In another aspect, a laser-based method for processing a workpiece is provided. The workpiece comprises a substrate and a layer formed on the substrate, where the substrate is substantially transparent at a laser wavelength. The method comprises generating a focused laser processing beam having at least one pulse, a beam diameter w0 at an internal substrate position, and a beam diameter w1 at or near the layer on the substrate, where w0<w1. The method also comprises removing at least a depthwise portion of the layer, and controllably modifying an internal portion of the substrate.

In another aspect, a laser-based system for processing a workpiece is provided. The workpiece comprises a substrate and a layer formed on the substrate, where the substrate is substantially transparent at a laser wavelength. The system comprises a laser source configured to generate a focused laser processing beam having at least one pulse, and focusing optics to produce a beam diameter w0 at an internal substrate position, and a beam diameter w1 at or near the layer on the substrate, where w0<w1. The system also comprises a controller configured to control the focusing optics and the laser source to remove at least a depthwise portion of the layer and to controllably modify an internal portion of the substrate.

BRIEF DESCRIPTION OF THE DRAWINGS

FIG. 1A illustrates a focused laser processing beam having a diameter $w_0$ at an internal substrate position, and diameter $w_1$ at or near a coating on a substrate. FIG. 1B illustrates a processing result in which a depthwise portion of the coating is removed over diameter $w_1$ and the substrate material is modified with a relatively high intensity over diameter $w_0$.

FIG. 2A shows a top view of examples of scribing lines formed in the ITO layer using different laser pulses energies (in nJ), which are listed below the respective scribing line. FIG. 2B shows an example depth profile measurement of the ITO layer removed with laser pulse energies that do not substantially ablate the glass surface.

FIG. 3A shows a top view of the ITO layer ablated with laser pulses at the threshold energy sufficient to remove the ITO layer while keeping the glass surface substantially ablation free. FIG. 3B is a side cross-sectional view of the glass substrate that shows the processing that occurred near the focal point positioned inside the glass sample using the same laser beam which ablated the ITO layer.

DETAILED DESCRIPTION

Overview

Utilization of a laser to separate dies of semiconductor devices, such as light emitting diodes (LEDs), from the original wafer can provide advantages compared to conventional mechanical dicing methods. Laser processing may be particularly advantageous when the wafer thickness decreases, and the device distribution becomes denser. Laser singulation methods can generally be categorized with either external processing or internal processing. In some external processing methods, laser processing (e.g., ablation) starts from the surface of the wafer. In some internal processing methods, the inside of the wafer is modified, such as by generating micro cracks, while leaving the surface relatively untouched. Some such internal processing methods leave very little or no cutting kerf, which allows a greater amount of the wafer to be utilized for circuitry. Some internal processing methods may generate little or no chipping on the surface; thus little or no pre- or post-processing may be needed. Such internal processing may increase or maximize the die strength. Additionally, since a large part of the separation edge may be cleaved, some such methods may provide superior optical performance. This can be beneficial for optical devices such as high brightness LEDs.

Although internal laser processing has many potential advantages, the material being processed generally should be substantially transparent to the wavelength of the laser, so that the laser energy can reach the inside of the wafer. However, some semiconductor devices have one or more coating layers disposed on a wafer substrate, as will be illustrated below. The coating layer formed on the substrate need not be in direct contact with the substrate, but may be separated from the substrate by one or more films or layers (e.g., dielectric films) therebetween. These coating layer(s) may be relatively opaque to the processing laser light. In this case, internal laser processing typically is not employed unless the relatively opaque coating is removed in advance. In other implementations, the internal laser processing may be applied from a side of the wafer without the opaque coating, which may not be desirable in some cases, because of processing convenience or other reasons.

Examples of Laser Processing Systems and Methods for Coated Materials

Figure 1A:
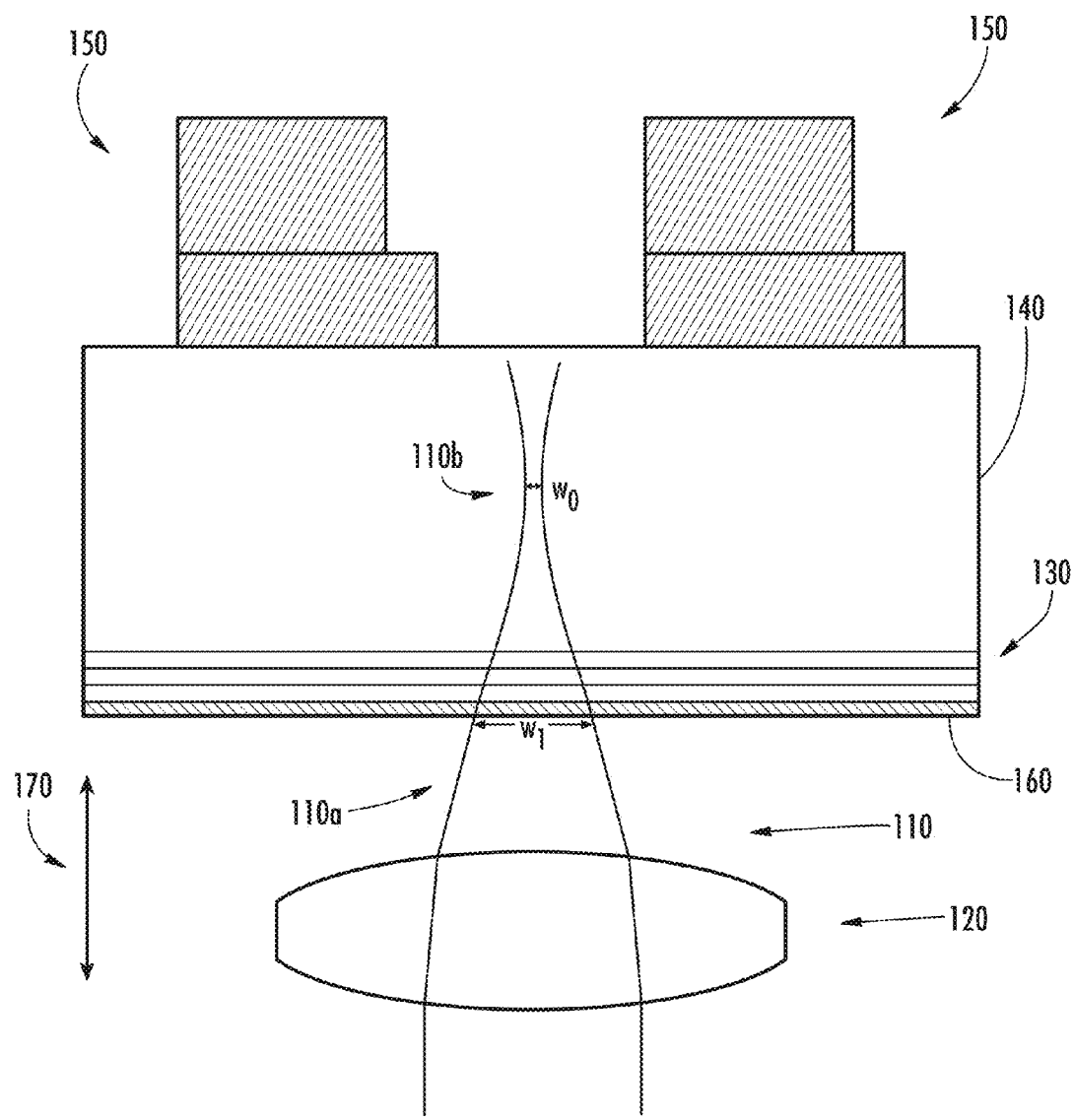
FIGS. 1A and 1B schematically illustrate an example of laser processing of a material workpiece and a corresponding result.
Figure 1B:
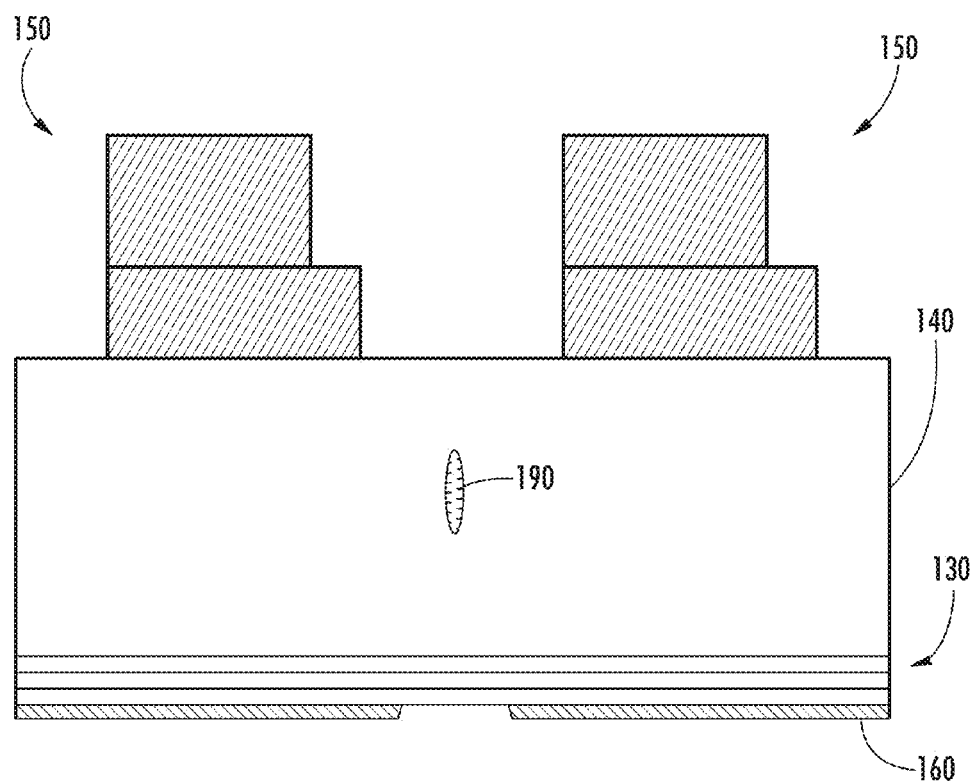

FIGS. 1A and 1B schematically illustrate an example of laser processing of a material workpiece. A processing laser beam can be focused to process the workpiece. The processing laser beam may include a pulsed laser, such as a fiber-based laser system operating at repetition rates in the kHz-MHz range. The workpiece can include a semiconductor wafer, a multilayer material, a composite material, or any other material. The workpiece can include a substrate and a coating. In some implementations, the workpiece includes a semiconductor wafer having multiple devices, for example high brightness LEDs, formed thereon. In some such cases, the LED can have a sapphire substrate with a thickness of a few 10 s to a few 100 s µm. Gallium nitride (GaN) based LEDs can be grown on top of the sapphire substrate. Although certain examples and experiments are described for GaN LEDs including a sapphire substrate, these examples and experiments are intended to be illustrative and not limiting. The methods and systems described herein can be used to laser process other workpieces and other types of coated substrates. For example, a substrate may comprise sapphire, glass, silicon, or silicon carbide. The substrate may comprise a material that is substantially transparent to the wavelength of the laser beam used for processing the workpiece. In some implementations a substrate may be weakly absorbing at the laser wavelength.

One singulation technique (that may be used for LED dies) is to tightly focus a laser beam, which is transparent to the sapphire substrate, inside the substrate. When the laser intensity is high enough, it can locally modify the substrate material, e.g., by making micro-cracks through the process of multi-photon absorption. The laser beam can be scanned along desired cutting lines, and then the wafer can be extended to separate the LED dies along the cutting lines. Such techniques are utilized in commercially available LED processing equipment.

To improve performance of the LED output, some semiconductor designs are arranged with a coating, for example a metal thin film layer on a surface of the sapphire substrate. The coating acts as a mirror to increase light emission. Although the thickness of the metal film may be only a few tens of nanometer to few tens of microns, the metal film can be sufficiently opaque to block the processing laser light from reaching inside of the substrate for the internal processing. In addition to its use for LEDs, a coating layer is common for a variety of other semiconductor devices. Some such devices can be used for electronic purposes, such as to form electrical contacts, and some devices can be used for optical purposes, and still other devices can be used for thermal or mechanical purposes. In many of these cases, the coating is removed either prior to or at the same time as die separation. Typically a multi-step-processing with multiple techniques is used to remove the coating.

Various embodiments described herein can eliminate a need for the multiple processing steps while maintaining or exceeding the functionality of singulation systems. In the example shown in FIG. 1A, the workpiece includes a portion of a GaN LED wafer. The wafer includes a sapphire substrate 140 that (optionally) includes a distributed Bragg reflector (DBR) 130 for reflecting visible wavelengths (WL) of light. A thin film metallic reflector 160 is formed or coated on a surface of the sapphire substrate. The metallic reflector 160 can include one or more layers of metal film. The metallic reflector 160 can (optionally) include one or more layers of dielectric. The example wafer also includes one or more GaN emitters 150 for the LED. The GaN emitters 150 are disposed on a side of the sapphire substrate 140 opposite to the side of the substrate that is coated with the metallic reflector 160. Focusing optics 120, e.g., a focal lens, can be used to adjust the focal properties of a laser beam 110 incident on the coated surface 160 of the substrate. For example, the laser source and focusing optics 120 and the workpiece can be relatively positioned so that the laser beam 110 is incident on the coated surface 160 of the substrate 140 before the laser beam 110 interacts with the substrate 140 (e.g., the coated surface can be disposed on an optical path between the substrate 140 and the focusing optics 120).

By way of example, $w_1$ represents a laser beam diameter at or near the surface of metallic reflector 160, and $w_0$ represents the laser beam diameter position within substrate 140, which corresponds to a beam waist in this example. The laser beam may have a more tight focus 110b in the interior of the substrate 140 than the focus 110a on the surface of the substrate (e.g., at the position of the coated surface 160). Thus, the intensity is higher over the diameter $w_0$ than the intensity over the diameter $w_1$. A beam delivery system (not shown) can be used to deliver the laser beam 110 from a laser source (e.g., a pulsed laser) to the workpiece. The beam delivery system can include a scanning system that relatively positions the laser beam and the workpiece. In various embodiments, the workpiece can be positioned relative to a fixed laser system, or the laser beam can be positioned relative to a fixed workpiece, or both the workpiece and the laser beam can be positioned relative to each other to achieve a desired scan.

In many cases of a workpiece including a substrate and one or more coating layers, the coating layer(s) and the substrate have different ablation thresholds. For example, the ablation threshold of a sapphire substrate is approximately 1.5 J/cm$^2$, when being processed using ultrafast laser pulses with a central wavelength around 1 µm and sufficient pulse overlap. The ablation threshold of a thin film metal coating may be about 1 to 2 orders of magnitude lower under the same processing conditions (e.g., ablation thresholds of about 0.01 to about 0.1 J/cm$^2$). In various implementations, the ablation threshold of the substrate is greater than the ablation threshold of the coating by a factor that can be 2, 5, 10, 15, 25, 50, 75, 100, 150, 200, 250, 1000, or more.

In certain implementations, the disclosed systems and methods can utilize this difference in ablation thresholds to apply the same laser beam for processing both the coating layer(s) and the substrate. The coating layer(s) can, but need not be, formed from a different material than the substrate. Focusing of the processing laser beam can be managed so that the laser intensity on the coating layer is different from the laser intensity near the internal processing point. For example, the laser beam can be relatively tightly focused 110b at the internal processing point (e.g., the focal spot of the laser beam) while the laser beam is more loosely focused (or relatively unfocused) 110a on the coating layer, as shown in FIG. 1A. The laser fluence can be adjusted so that the laser intensity on the coating layer is higher than the ablation threshold of the coating layer but still lower than the ablation threshold of the substrate. Therefore, the processing laser can remove the coating layer while not ablating the substrate surface. The laser intensity at an internal portion of the substrate (e.g., at the focus 110b) can be higher than the ablation threshold of the substrate, and the processing laser can internally modify the substrate (e.g., at or nearby the position of the focus 110b). Accordingly, in the example shown in FIG. 1A, the laser beam can ablate the coating layer and modify the internal portion of the substrate substantially simultaneously.

FIG. 1B schematically illustrates a result of processing the workpiece with one or more laser beams. An ablated portion of metallic layer 160 at the substrate surface is shown. As will be discussed below, by reducing heat affected zones near the processed part of the metallic film, the substrate surface can remain sufficiently transmissive such that the laser beam can pass through the surface regions to reach the interior of the substrate for internal processing and material modification to create an internal feature 190 at or near focal position 110b. For example, DBR 130 may be transmissive at near infrared (IR) laser wavelengths and the incident laser beam, with diameter $w_1$, below an ablation threshold for modification of DBR materials. In some implementations all or a portion of the DBR dielectric layers in the beam path may be removed and the internal feature 190 formed.

The focal properties of the laser beam can be managed to control the intensity ratio between the surface and the focal spot inside the substrate, so that the intensity at the focal spot inside the substrate is greater than the substrate ablation threshold. Thus, internal processing of the substrate material can be performed. In some implementations, a controller can be used to manage or adjust the properties of the laser beam pulses, the focal conditions of the laser beam pulses, the relative positioning of the workpiece and the laser beam pulses, and so forth. In some embodiments a dynamic focusing mechanism may be utilized to adjust the focal position, for example with relative translation 170 of optical components and/or substrate 140, for example. In some embodiments a controllable telescope (not shown) may be utilized to adjust the laser beam size before the focusing lens. Changing the beam size can change the ratio between the fluence at the focal point, $w_0$, and the fluence at or near a layer. Such an arrangement may be used to optimize the processing conditions for different substrate thicknesses (e.g., focus depth) and film ablation thresholds. Such arrangements, and other techniques and systems for controlling laser parameters, are disclosed in U.S. Pat. No. 7,486,705, assigned to the assignee of the present application, and may be used with various embodiments disclosed herein. U.S. Pat. No. 7,486,705 is hereby incorporated by reference herein in its entirety for all it discloses. Commercially available dynamic focusing arrangements utilizing motorized lens systems may be used in some implementations, and may be used in combination with beam scanning mechanisms.

Table I lists examples of the processing laser pulse energy and focal conditions such that the laser intensity is approximately at the ablation threshold of both the substrate and the coating layer. In Table I, examples of the thin film ablation threshold being 3 times and 100 times weaker than the substrate ablation threshold are shown, and two different focal depths from the surface of the substrate are shown.

TABLE I

Examples of laser pulse energy and focal condition under different processing conditions

| | Thin film ablation threshold (relative to ablation threshold of substrate) | | | |
|---|---|---|---|---|
| | 1/3 | 1/3 | 1/100 | 1/100 |
| Distance of focal spot from substrate surface (µm) | 50 | 200 | 50 | 200 |
| Focal spot radius (µm) | 2.6 | 5.2 | 0.98 | 1.96 |
| Laser pulse energy (µJ) | 0.32 | 1.27 | 0.045 | 0.18 |
| Focal lens numerical aperture (NA) | 0.13 | 0.06 | 0.34 | 0.17 |

The example laser energy and focal conditions summarized in Table I are for example cases when the laser intensity at the thin film coating and at the substrate are at the ablation threshold. In some singulation applications, it may be desired that the laser intensity be some level above the ablation threshold (at the coating and/or in the substrate), or the energy loss may need to be considered. In those cases, the focusing of processing laser beam and/or the laser pulse energy may be adjusted accordingly relative to the examples shown in Table I.

In various implementations, various types of pulsed lasers, for example, nanosecond, picosecond, or femtosecond pulsed lasers, can be used for processing coated substrates. Ultrashort pulsed lasers (e.g., with pulse widths from tens of femtoseconds to about a picosecond) may be desirable in many processing applications. For example, an ultrashort pulsed laser may provide sufficiently high peak laser intensity for multi-photon internal processing. Ultrashort laser pulses are generally able to process wide varieties of materials as compare to continuous wave (cw) or longer pulsed lasers. Further, ultrashort laser pulses may process the workpiece material such that there are reduced or minimal heat affected zones (HAZs). Reducing the amount of HAZ can be advantageous to remove the coating layer(s) while still keeping the substrate surface sufficiently optically smooth to allow the processing laser beam to propagate through the surface for internal processing.

Figure 2A:
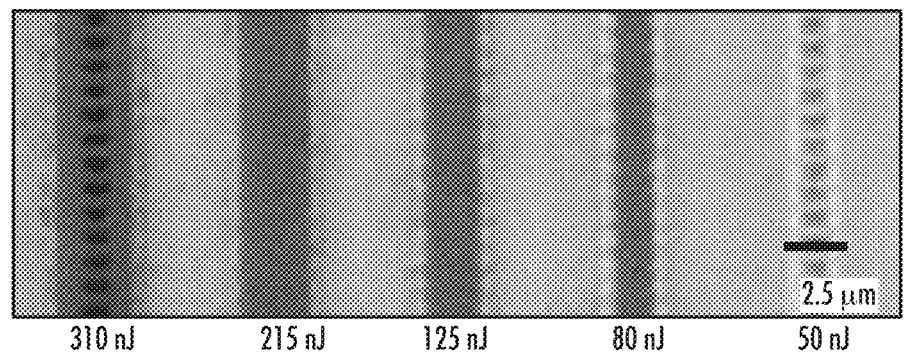
FIGS. 2A and 2B show example experimental results for ablation of an indium tin oxide (ITO) layer on a glass substrate.
Figure 2B:
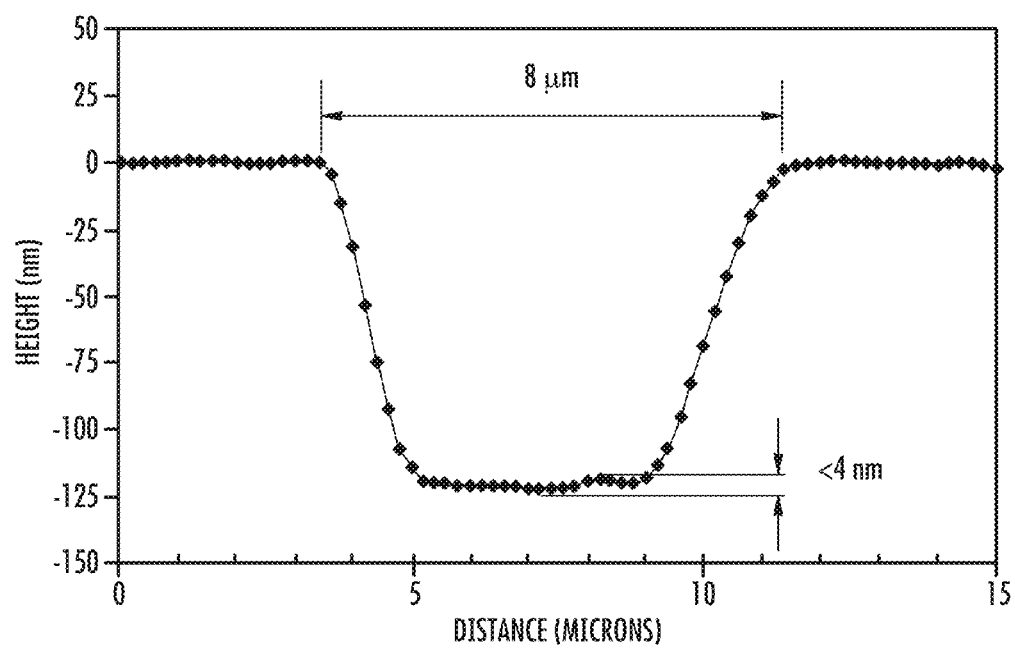

Another commonly used coating on semiconductor wafers includes indium tin oxide (ITO). FIGS. 2A and 2B show example experimental results for ablation of an ITO layer on a glass substrate. The ITO layer had a thickness of about 120-150 nm. The laser was an ultrafast fiber laser with a central wavelength of 1.045 µm, generating pulses with pulse widths of about 0.4 ps, and at a repetition rate of 100 kHz. With management of the laser pulse energy, the experimental results demonstrate that the ITO layer can be removed while still leaving the glass surface substantially unmodified. FIG. 2A shows a top view of examples of scribing lines formed in the ITO layer using different laser pulses energies, which are listed below the respective scribing line. FIG. 2A shows that the widths of the scribing lines increase as the laser pulse energy increases. An inset showing a 2.5 µm long bar is provided for comparison. This example illustrates damage of the glass surface that occurred at a pulse energy of 310 nJ. The indium tin oxide (ITO) layer was partially removed with 50 nJ pulses. A clear trench on the ITO film was achieved with other laser energies above 50 nJ, and without damage to the glass surface (for pulse energies below about 310 nJ).

FIG. 2B shows an example depth profile measurement of the ITO layer removed with optimized laser pulse energies. A substantially flat bottom of the ablation trench demonstrates that the ITO was substantially removed while the glass surface was substantially undamaged and ablation free. The bottom of the depth profile is substantially flat to less than about 4 nm. The width of the scribed line, at the upper surface of the remaining ITO layer, is about 8 µm in this example. The width of the scribed line, at the glass surface, is about 4 µm in this example.

As shown in the above examples, when the laser pulse energy is sufficiently low, the laser beam only partially removes the ITO layer. At threshold pulse energy, the entire depthwise portion of the ITO layer was removed, while the underlying glass surface was not damaged. Laser pulse energies above the threshold ablate the glass surface while also removing the ITO layer. Because a threshold can depend on laser pulse parameters, for example beam focus and pulse overlap, it is to be understood that the threshold may vary from a nominal value. For example, the results of FIG. 2A were obtained with twice the spot-to-spot overlap relative to that of FIG. 2B. The damage threshold for glass was slightly different in the two experiments. It is known that the damage threshold for glass is not linearly proportional to the pulse overlap. In various implementations for substrate processing such variable conditions may be included for determination of a process window, and for corresponding adjustments to compensate for variations in materials or laser processing conditions.

Figure 3A:
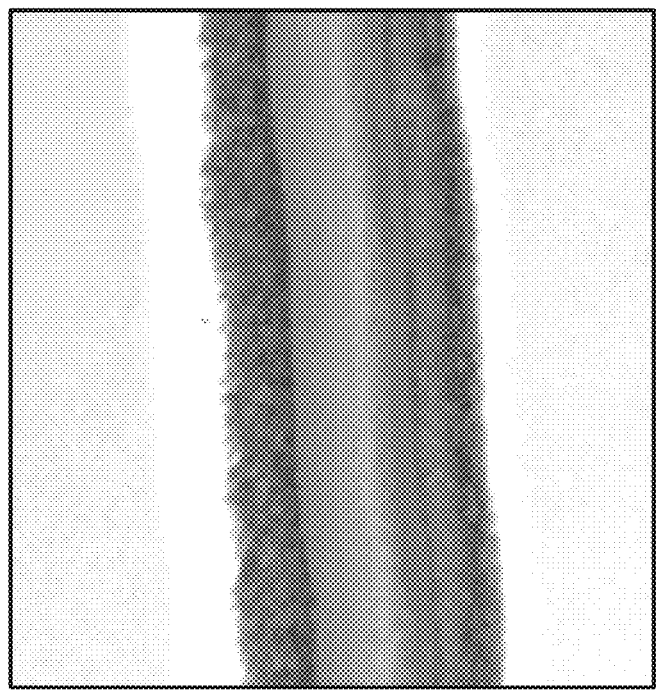
FIGS. 3A and 3B show an experimental result of using a single laser beam to process an ITO layer on the surface of a glass substrate and the inside of the glass substrate in parallel.
Figure 3B:
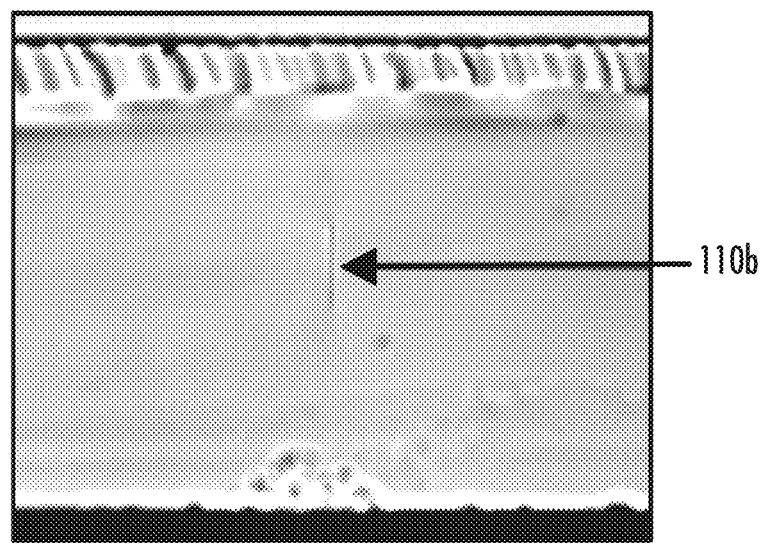

FIGS. 3A and 3B show an experimental result using a single laser beam to process an ITO layer on the surface of a glass substrate while processing the inside of the glass substrate. The laser beam was focused 0.2 mm below the glass surface with a beam waist of about 2.5 µm. The beam spot diameter on the ITO layer was about 36 µm. The laser intensity at the focal spot inside the glass was about 50 times larger than the laser intensity on the ITO layer. In this example the laser pulse energy incident on the sample was 3 µJ, the pulse width 0.4 ps, and the pulse repetition rate was 100 kHz. As discussed above, by increasing the laser pulse energy, the ITO layer removal varies from insufficient ablation to remove the layer (e.g., at laser pulse energies below threshold), to optimized ablation to remove the layer without damaging the glass surface (e.g., at laser pulse energies at or just above the threshold), to over ablation which removes the ITO layer but also at least partially ablates the glass surface (e.g., at laser pulse energies substantially above the threshold).

FIG. 3A shows a top view of the ITO layer ablated with laser pulses at the threshold energy sufficient to remove the ITO layer while keeping the glass surface substantially ablation free. The ITO layer was removed with a trench width of 22 µm. FIG. 3B is a side cross-sectional view of the glass substrate that shows the processing that occurred around the focal spot positioned inside the glass sample using the same laser beam which ablated the ITO layer. The experiment demonstrates that, by using desired focal conditions, the disclosed systems and methods can remove a coating layer on a substrate while internally processing the substrate using the same laser beam during the same processing pass.

Figure 4A:
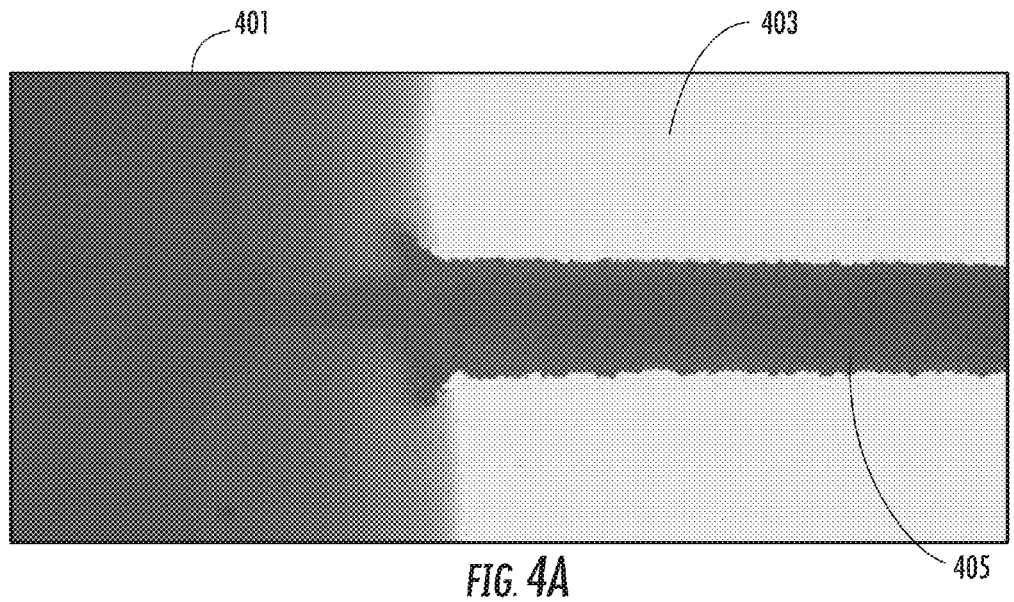
FIGS. 4A and 4B show example results of single pass processing in which a gold coating deposited on a sapphire substrate was ablated and an internal scribe line was formed in the substrate. The processing occurred with high spatial overlap between adjacent laser pulses, and during relative translation of the substrate and the laser pulses in the single pass.
Figure 4B:
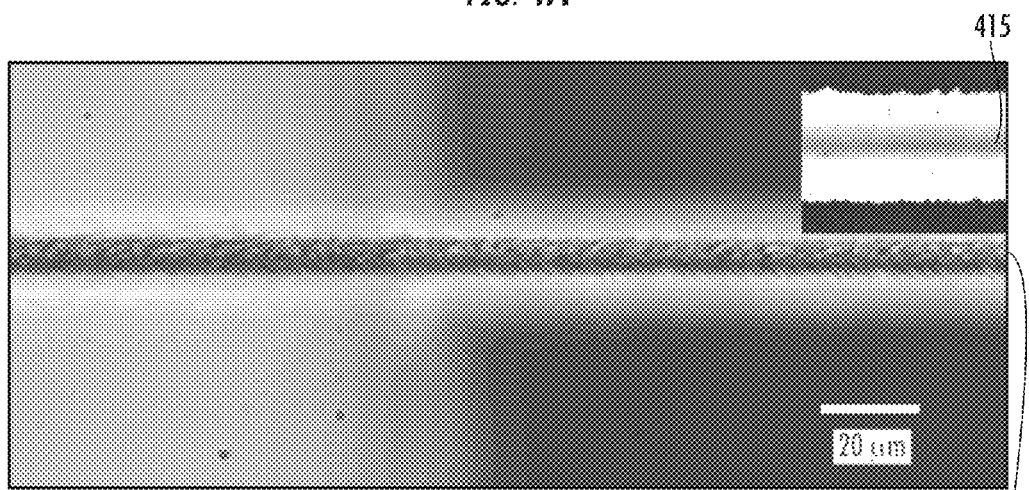

FIGS. 4A and 4B show example results of single pass processing in which a gold coating deposited on a sapphire substrate was ablated and an internal scribe line was formed in the substrate. The processing occurred with high spatial overlap between adjacent pulses, and during relative translation of the substrate with respect to the laser pulses in the single pass. The laser system was the same as for the example experiments described with reference to FIGS. 2A, 2B, 3A, and 3B. Each beam was focused such that the beam waist, $w_0$, was formed about 100 µm below the substrate surface. The substrate comprised a c-plane orientated sapphire wafer, having a 400 µm thickness. Both the front and back surfaces of the wafer were polished. A gold thin film, approximately 100 nm thick, was deposited on half of polished sapphire wafer. The processing laser beam was scanned relative to the coated/uncoated boundary. In this example high spot overlap of about 99% or greater was used.

FIG. 4A shows a high magnification (50×) microscope image of portions of the substrate, taken with bright field illumination. The left side of the image shows bare wafer 401 and the right side shows a portion 403 of the gold coated surface. The gold coating was cleanly removed along a scribe line as illustrated in the image portion 405 of the narrow depth of field image. No damage of sapphire surface was observed in this experiment.

FIG. 4B is a transmission image of the same portion of the sample, where microscope focus was adjusted toward an internal region of the substrate rather than on its surface. A uniform internal scribe line 411 across the gold coating boundary to the bare wafer was observed. The experiment result indicates removal of gold coating and internal processing of sapphire substrate. FIG. 4B shows that the internal processing of the sapphire wafer occurred in both the uncoated 401 and gold coated 403 portions of the substrate.

The inset illustrates a transmission image of the defocused scribe line 415 through the removed region of gold coating with focus on the surface of the substrate. In effect, the removed gold forms an aperture through which the scribe line is observable with microscopic viewing. The uniform transmission of light in the region where gold was removed indicates clean gold coating removal and no damage on the sapphire surface, which allows the processing laser pulses to transmit through this removal area. Notably, the internal scribing line is barely affected by the gold coating on substrate surface.

Beam focus and laser fluence are some of the factors to consider for scribing. As shown in the above examples, if laser intensity on the gold coating is too high, then the processing beam can damage the sapphire surface while removing the gold coating. On the other hand, if the laser intensity is too low, then the power loss on gold film removal will result in a weaker scribing line under the gold coating as compared to under a bare sapphire wafer. Such lower laser intensity can cause gold coating removal without internal scribing.

In the experiments described with reference to FIGS. 2A-4B, the capability of removing conductive films (e.g., ITO and gold in these examples), and modifying an internal portion of the substrate was demonstrated for single pass operation. The intensity at the beam waist, $w_0$, inside the transparent substrate, was sufficiently high to modify the substrate material, yet the intensity over the defocused diameter, $w_1$, at the substrate surface, was sufficient to cleanly remove a layer of metal film. Such an arrangement may simplify processing and increase throughput, because, the internal and surface processing can be performed in a single pass with the same set of laser parameters (e.g., beam focus and fluence). However, it is to be understood that in some embodiments a group of laser pulses generated at a high repetition rate may be utilized, effectively resulting in a further increase in overlap. Moreover, in some embodiments the method and systems disclosed herein may be utilized in combination with processing arrangements in which multiple depthwise focused beams are simultaneously or sequentially applied to the target material with multiple passes. For example, methods and systems described in U.S. Patent Publication No. 2010/0025387, which is owned by the assignee of the present application, may be used with embodiments disclosed herein. The '387 Publication teaches, among other things, that a single pass of a focused beam of ultrashort laser pulses may be used to create a surface groove in a transparent material and at least one modified region within the bulk of the material. The surface groove and at least one modified region are each formed by interaction the focused beam with the material. U.S. Patent Publication No. 2010/0025387 is hereby incorporated by reference herein in its entirety for all it discloses. Also, two or more laser passes can be used in some implementations.

Figure 5:
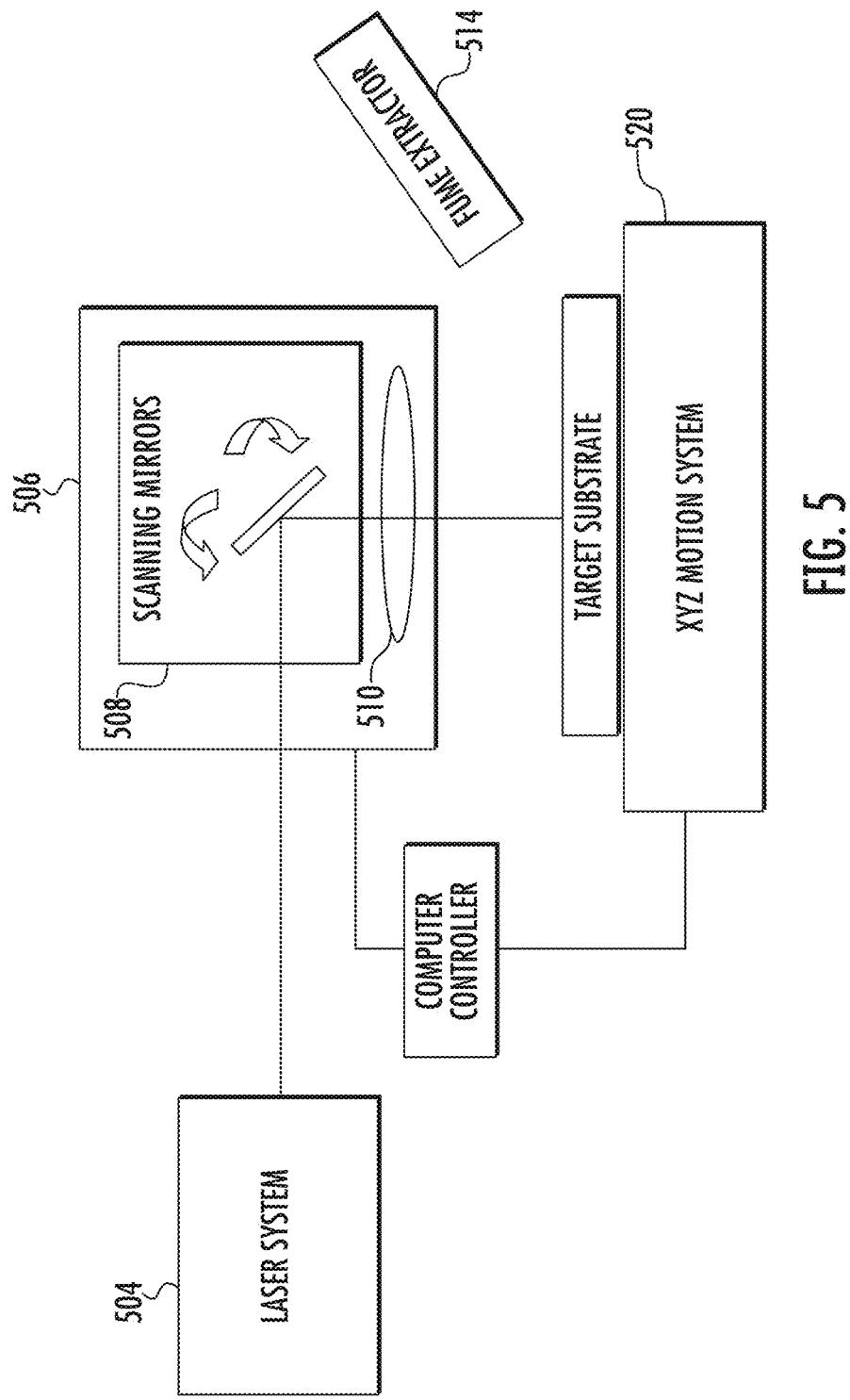
FIG. 5 schematically illustrates examples of some components that can be used for ultrashort laser processing. The example processing system comprises a laser system that is operatively coupled to a controller and scanning system.

FIG. 5 schematically illustrates examples of some components that can be used for ultrashort laser processing. The processing system can comprise a laser system 504 that is operatively coupled to a controller and scanning system 506. In some embodiments, the laser system 504 is configured to output laser pulses that comprise one or more ultrashort pulses (USP). In some implementations the USP laser comprises a fiber-based chirped pulse amplification system that generates femtosecond (fs) pulses with energy exceeding 1 µJ, at a repetition rate of 100 KHz or greater. Such fiber based systems are commercially available from IMRA America, Inc (Ann Arbor, Mich.). In various embodiments the USP system will provide for adjustment of certain pulse parameters over a substantial range.

In the embodiment illustrated in FIG. 5, the scanning system 506 includes two beam deflectors 508, for example galvanometric scanning mirrors, capable of two-dimensional scanning. In other embodiments, a different number and/or type of scanning mirrors may be used. In some embodiments, the scanning may be one-dimensional. The scanning system 506 may also include focusing optics 510 such as, for example, an integrated F-theta lens capable of producing a substantially flat field of view at the target substrate. An optional motion system 520 may position the substrate in one-, two-, or three-dimensions, and may further provide mechanism(s) for rotation of the substrate (e.g.: roll, pitch, and yaw). In some embodiments the substrate may be processed during motion of the stage. An optional fume extractor 514 may be included to capture any debris.

In some embodiments a laser pulse width may be in the range from femtoseconds (fs) to tens of picoseconds (ps), and most preferably up to a few hundred fs. Pulse energy may be in the range from about 10 nJ to 100 nJ, and up to a few hundred µJ. Pulse repetition rates may be in the kHz to MHz range, and preferably from about 100 kHz to about 1 MHz. A spot diameter, $w_0$, corresponding to a beam waist position inside the substrate, may be in the range from a few µm to a few tens of µm. A spot diameter, $w_1$, corresponding to a diameter at or near the surface of the substrate, may be in the range from tens of microns to a few hundred microns. Spatial overlap between pulses may vary with scan speed and pulse rate, and may be greater than about 70%, greater than about 80%, greater than about 90%, or greater than about 99%. The examples of nominal parameters listed above are not necessarily independent. For example, the fluence can depend on both the spot size and pulse energy, and the ablation rate in turn can depend on the fluence and pulse overlap. A laser wavelength may be in the near IR range, e.g., from about 700 nm up to a few microns. In the above examples, layer(s) included ITO and/or gold conductive layers. Other suitable layer materials may be utilized in various implementations, and may include conductor(s), semiconductor(s), or dielectric(s). For example, some integrated circuits are fabricated with low-k dielectric layer(s) deposited on silicon carbide (SiC). In some implementations, the low-k dielectric was removed, and an internal portion of the SiC was modified, in a single pass.

Various embodiments and examples of this disclosure illustrate how a single laser beam with a pre-determined fluence may remove a portion of a layer disposed on a substrate and modify an internal portion of the substrate, and do so nearly simultaneously, and without a requirement for intervening depthwise adjustment of a focused laser beam position. In certain implementations a group of time separated ultrafast laser pulses with pre-determined spatial overlap between the pulses may be utilized, and without a requirement for intervening depthwise adjustment of a focused laser beam position. For example, pulse-to-pulse overlap, produced by the combination of translation speed and laser pulse repetition rate, can be selected so that there is sufficient overlap, wherein the first pulses ablate and remove the top layer without damaging the substrate surface and the subsequent pulses, impinging on the same area of the substrate, focused below the surface, generate the subsurface material modification. Many other variations are possible. For example, processing is not restricted to a single substrate and single layer disposed thereon. In at least one embodiment a transparent medium which, for example, may include glass or thin films, may be disposed between the focusing optics 120 and the layer(s) and substrate. In such arrangements the optical system can be adjusted, or otherwise modified, to provide proper fluence at depthwise location(s) to be processed.

The example experiments, experimental data, tables, graphs, plots, photographs, figures, and processing and/or operating parameters (e.g., values and/or ranges) described herein are intended to be illustrative of some possible operating conditions of the disclosed systems and methods and are not intended to limit the scope of the operating conditions for other embodiments of the methods and systems disclosed herein. Additionally, the experiments, experimental data, calculated data, tables, graphs, plots, photographs, figures, and other data disclosed herein demonstrate various regimes in which embodiments of the disclosed systems and methods may operate effectively to produce one or more desired results. Such operating regimes and desired results are not limited solely to specific values of operating parameters, conditions, or results shown, for example, in a table, graph, plot, figure, or photograph, but also include suitable ranges including or spanning these specific values. Accordingly, the values disclosed herein include the range of values between any of the values listed or shown in the tables, graphs, plots, figures, photographs, etc. Additionally, the values disclosed herein include the range of values above or below any of the values listed or shown in the tables, graphs, plots, figures, photographs, etc. as might be demonstrated by other values listed or shown in the tables, graphs, plots, figures, photographs, etc. Also, although the data disclosed herein may establish one or more effective operating ranges and/or one or more desired results for certain embodiments, it is to be understood that not every embodiment need be operable in each such operating range or need produce each such desired result. Further, other embodiments of the disclosed systems and methods may operate in other operating regimes and/or produce other results than shown and described with reference to the example experiments, experimental data, tables, graphs, plots, photographs, figures, and other data herein.

Other systems, setups, and parameters may be used in other implementations, which may provide the same or different results. Many variations are possible and are contemplated within the scope of this disclosure. Films, layers, components, features, structures, and/or elements may be added, removed, combined, or rearranged. Additionally, process or method steps may be added, removed, or reordered. No single feature or step, or group of features or steps, is indispensable or required for each embodiment.

For purposes of this disclosure, certain aspects, advantages, and novel features are described herein. It is to be understood that not necessarily all such advantages may be achieved in accordance with any particular embodiment. Thus, for example, those skilled in the art will recognize that the systems and methods may be embodied or carried out in a manner that achieves one advantage or group of advantages as taught herein without necessarily achieving other advantages as may be taught or suggested herein. Furthermore, embodiments may include several novel features, no single one of which is solely responsible for the embodiment's desirable attributes or which is essential to practicing the systems and methods described herein. Additionally, in any method or process disclosed herein, the acts or operations of the method or process may be performed in any suitable sequence and are not necessarily limited to any particular disclosed sequence.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a" and "an" as used in this application and the appended claims are to be construed to mean "one or more" or "at least one" unless specified otherwise.

While certain embodiments of the inventions disclosed herein have been described, these embodiments have been presented by way of example only, and are not intended to limit the scope of the inventions disclosed herein. No single feature of group of features is necessary or indispensable for each embodiment. Reference throughout this disclosure to "some embodiments," "an embodiment," or the like, means that a particular feature, structure, step, process, or characteristic described in connection with the embodiment is included in at least one embodiment. Thus, appearances of the phrases "in some embodiments," "in an embodiment," or the like, throughout this disclosure are not necessarily all referring to the same embodiment and may refer to one or more of the same or different embodiments. Indeed, the novel methods and systems described herein may be embodied in a variety of other forms; furthermore, various omissions, substitutions, equivalents, and changes in the form of the methods and systems described herein may be made without departing from the spirit of the inventions disclosed herein.

What is claimed is:

1. A method for processing a workpiece, the workpiece comprising a substrate and at least one layer formed on the substrate, the at least one layer having an ablation threshold that is less than an ablation threshold of the substrate, the method comprising:
   providing laser pulses having a pulse energy and a wavelength, wherein the substrate is substantially transparent to the laser pulses at the wavelength;
   delivering the laser pulses to the workpiece; and
   adjusting fluence and focal conditions of the laser pulses such that:
      (1) intensity of the laser pulses in or near the at least one layer is at or above the ablation threshold of a layer in the at least one layer and below the ablation threshold of the substrate, and
      (2) intensity of the laser pulses near a focal spot in the substrate is at or above the ablation threshold of the substrate,
   wherein a laser pulse removes a depthwise portion of said at least one layer and controllably modifies an internal portion of said substrate.

2. The method of claim 1, wherein the substrate is substantially transparent to the laser pulses at the wavelength.

3. The method of claim 1, wherein said at least one layer comprises a conductive film.

4. The method of claim 3, wherein said conductive film comprises ITO.

5. The method of claim 3, wherein said conductive film comprises gold.

6. The method of claim 3, further comprising at least one dielectric layer disposed between said conductive film and said substrate, said at least one dielectric layer being substantially transparent at the wavelength of said laser pulses.

7. The method of claim 6, wherein said at least one dielectric layer comprises multiple dielectric layers.

8. The method of claim 1, wherein said at least one layer comprises a low-k dielectric.

9. The method of claim 1, wherein said processing with laser pulses having said intensity in or near said layer cleanly removes said at least one layer, said pulses having said intensity in said substrate modifies an internal portion of said substrate, and wherein the surface of said substrate is substantially undamaged with said processing.

10. The method of claim 1, wherein at least a portion of said processing is carried out during relative motion of said substrate and said laser pulses, and in a single pass.

11. A laser-based method for processing a workpiece, the workpiece comprising a substrate and at least one layer formed on the substrate, wherein the substrate is substantially transparent at a laser wavelength, said method comprising:
generating a focused laser processing beam having at least one pulse, a beam diameter $w_0$ at an internal substrate position, and a beam diameter $w_1$ at or near said at least one layer on said substrate, wherein $w_0 < w_1$;
removing at least a depthwise portion of said at least one layer; and
controllably modifying an internal portion of said substrate.

12. The laser-based method of claim 11, wherein said removing and said controllably modifying are carried out with a single laser pulse.

13. The laser-based method of claim 11, wherein said removing and said controllably modifying are carried out with multiple laser pulses having spatial overlap between adjacent laser pulses.

14. The laser-based method of claim 13, wherein said overlap is at least about 99%.

15. The laser-based method of claim 13, wherein said multiple laser pulses are generated at a repetition rate of at least about 100 KHz.

16. The laser-based method of claim 11, wherein said at least one layer is relatively opaque at a laser wavelength as compared to said substrate.

17. The laser based method of claim 11, wherein a pulse width of at least one laser pulse is in a range from tens of femtoseconds up to tens of picoseconds.

* * * * *